(12) United States Patent
Perera

(10) Patent No.: US 9,082,837 B2
(45) Date of Patent: Jul. 14, 2015

(54) NONVOLATILE MEMORY BITCELL WITH INLAID HIGH K METAL SELECT GATE

(71) Applicant: Freescale Semiconductor, Inc., Austin, TX (US)

(72) Inventor: Asanga H. Perera, West Lake Hills, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 2 days.

(21) Appl. No.: 13/962,338

(22) Filed: Aug. 8, 2013

(65) Prior Publication Data

US 2015/0041875 A1    Feb. 12, 2015

(51) Int. Cl.
| | |
|---|---|
| *H01L 29/78* | (2006.01) |
| *H01L 29/66* | (2006.01) |
| *H01L 21/28* | (2006.01) |
| *H01L 29/423* | (2006.01) |
| *H01L 29/788* | (2006.01) |
| *H01L 27/115* | (2006.01) |

(52) U.S. Cl.
CPC .......... *H01L 29/78* (2013.01); *H01L 21/28273* (2013.01); *H01L 27/11521* (2013.01); *H01L 27/11531* (2013.01); *H01L 29/42328* (2013.01); *H01L 29/66477* (2013.01); *H01L 29/66825* (2013.01); *H01L 29/7881* (2013.01)

(58) Field of Classification Search
CPC . H01L 29/78; H01L 27/115; H01L 29/66477; H01L 27/11531; H01L 21/28273; H01L 29/66825; H01L 29/7881; H01L 27/11521; H01L 29/42328; H01L 29/7831; H01L 29/66484; H01L 21/82; H01L 21/336; H01L 29/792

USPC .................. 257/314, 410, E21.409, E21.422, 257/E21.423, E21.662; 438/129, 257, 258, 438/259, 261, 266
See application file for complete search history.

(56) References Cited

U.S. PATENT DOCUMENTS

| | | |
|---|---|---|
| 5,614,746 A | 3/1997 | Hong et al. |
| 6,087,225 A | 7/2000 | Bronner et al. |
| 6,130,168 A | 10/2000 | Chu et al. |
| 6,194,301 B1 | 2/2001 | Radens et al. |
| 6,235,574 B1 | 5/2001 | Tobben et al. |
| 6,333,223 B1 | 12/2001 | Moriwaki et al. |
| 6,388,294 B1 | 5/2002 | Radens et al. |
| 6,509,225 B2 | 1/2003 | Moriwaki et al. |
| 6,531,734 B1 | 3/2003 | Wu |
| 6,635,526 B1 | 10/2003 | Malik et al. |
| 6,707,079 B2 | 3/2004 | Satoh et al. |

(Continued)

FOREIGN PATENT DOCUMENTS

WO    2009058486    5/2009

OTHER PUBLICATIONS

Office Action mailed Dec. 5, 2014 for U.S. Appl. No. 13/971,987, 5 pages.

(Continued)

*Primary Examiner* — Selim Ahmed

(57) ABSTRACT

A process integration is disclosed for fabricating non-volatile memory (NVM) cells having recessed control gates (118, 128) on a first substrate area (111) which are encapsulated in one or more planar dielectric layers (130) prior to forming in-laid high-k metal select gates and CMOS transistor gates (136, 138) in first and second substrate areas (111, 113) using a gate-last HKMG CMOS process flow without interfering with the operation or reliability of the NVM cells.

19 Claims, 4 Drawing Sheets

(56) References Cited

U.S. PATENT DOCUMENTS

| | | | |
|---|---|---|---|
| 6,777,761 | B2 | 8/2004 | Clevenger et al. |
| 6,785,165 | B2 | 8/2004 | Kawahara et al. |
| 6,861,698 | B2 * | 3/2005 | Wang .................. 257/316 |
| 6,939,767 | B2 | 9/2005 | Hoefler et al. |
| 7,154,779 | B2 | 12/2006 | Mokhlesi et al. |
| 7,183,159 | B2 | 2/2007 | Rao et al. |
| 7,190,022 | B2 | 3/2007 | Shum et al. |
| 7,202,524 | B2 | 4/2007 | Kim et al. |
| 7,208,793 | B2 | 4/2007 | Bhattacharyya |
| 7,256,125 | B2 | 8/2007 | Yamada et al. |
| 7,271,050 | B2 | 9/2007 | Hill |
| 7,365,389 | B1 | 4/2008 | Jeon et al. |
| 7,391,075 | B2 | 6/2008 | Jeon et al. |
| 7,402,493 | B2 | 7/2008 | Oh et al. |
| 7,405,968 | B2 | 7/2008 | Mokhlesi et al. |
| 7,439,134 | B1 | 10/2008 | Prinz et al. |
| 7,476,582 | B2 | 1/2009 | Nakagawa et al. |
| 7,521,314 | B2 | 4/2009 | Jawarani et al. |
| 7,524,719 | B2 | 4/2009 | Steimle et al. |
| 7,544,490 | B2 | 6/2009 | Ferrari et al. |
| 7,544,980 | B2 | 6/2009 | Chindalore et al. |
| 7,544,990 | B2 | 6/2009 | Bhattacharyya |
| 7,560,767 | B2 | 7/2009 | Yasuda et al. |
| 7,745,344 | B2 | 6/2010 | Chindalore |
| 7,795,091 | B2 | 9/2010 | Winstead et al. |
| 7,799,650 | B2 | 9/2010 | Bo et al. |
| 7,816,727 | B2 | 10/2010 | Lai et al. |
| 7,821,055 | B2 | 10/2010 | Loiko et al. |
| 7,906,396 | B1 | 3/2011 | Chiang et al. |
| 7,932,146 | B2 | 4/2011 | Chen et al. |
| 7,989,871 | B2 | 8/2011 | Yasuda |
| 7,999,304 | B2 | 8/2011 | Ozawa et al. |
| 8,017,991 | B2 | 9/2011 | Kim et al. |
| 8,043,951 | B2 | 10/2011 | Beugin et al. |
| 8,063,434 | B1 | 11/2011 | Polishchuk et al. |
| 8,093,128 | B2 | 1/2012 | Koutny et al. |
| 8,138,037 | B2 | 3/2012 | Chudzik et al. |
| 8,168,493 | B2 | 5/2012 | Kim |
| 8,173,505 | B2 | 5/2012 | Herrick et al. |
| 8,298,885 | B2 | 10/2012 | Wei et al. |
| 8,334,198 | B2 | 12/2012 | Chen et al. |
| 8,372,699 | B2 | 2/2013 | Kang et al. |
| 8,389,365 | B2 | 3/2013 | Shroff et al. |
| 8,399,310 | B2 | 3/2013 | Shroff et al. |
| 8,524,557 | B1 | 9/2013 | Hall et al. |
| 8,536,006 | B2 | 9/2013 | Shroff et al. |
| 8,536,007 | B2 | 9/2013 | Shroff et al. |
| 8,679,927 | B2 | 3/2014 | Ramkumar et al. |
| 8,871,598 | B1 | 10/2014 | Perera |
| 8,901,632 | B1 | 12/2014 | Perera et al. |
| 2001/0049166 | A1 | 12/2001 | Peschiaroli et al. |
| 2002/0061616 | A1 | 5/2002 | Kim et al. |
| 2003/0022434 | A1 | 1/2003 | Taniguchi et al. |
| 2004/0075133 | A1 | 4/2004 | Nakagawa et al. |
| 2004/0188753 | A1 | 9/2004 | Kawashima et al. |
| 2004/0262670 | A1 | 12/2004 | Takebuchi et al. |
| 2005/0145949 | A1 | 7/2005 | Sadra et al. |
| 2006/0038240 | A1 | 2/2006 | Tsutsumi et al. |
| 2006/0046449 | A1 | 3/2006 | Liaw |
| 2006/0099798 | A1 | 5/2006 | Nakagawa |
| 2006/0134864 | A1 | 6/2006 | Higashitani et al. |
| 2006/0211206 | A1 | 9/2006 | Rao et al. |
| 2006/0221688 | A1 | 10/2006 | Shukuri et al. |
| 2007/0037343 | A1 | 2/2007 | Colombo et al. |
| 2007/0077705 | A1 | 4/2007 | Prinz et al. |
| 2007/0115725 | A1 | 5/2007 | Pham et al. |
| 2007/0215917 | A1 | 9/2007 | Taniguchi |
| 2007/0224772 | A1 | 9/2007 | Hall et al. |
| 2007/0249129 | A1 | 10/2007 | Hall et al. |
| 2007/0264776 | A1 | 11/2007 | Dong et al. |
| 2008/0029805 | A1 | 2/2008 | Shimamoto et al. |
| 2008/0050875 | A1 | 2/2008 | Moon et al. |
| 2008/0067599 | A1 | 3/2008 | Tsutsumi et al. |
| 2008/0105945 | A1 | 5/2008 | Steimle et al. |
| 2008/0121983 | A1 | 5/2008 | Seong et al. |
| 2008/0128785 | A1 | 6/2008 | Park et al. |
| 2008/0145985 | A1 | 6/2008 | Chi |
| 2008/0185635 | A1 | 8/2008 | Yanagi et al. |
| 2008/0237690 | A1 | 10/2008 | Anezaki et al. |
| 2008/0237700 | A1 | 10/2008 | Kim et al. |
| 2008/0283900 | A1 | 11/2008 | Nakagawa et al. |
| 2008/0290385 | A1 | 11/2008 | Urushido |
| 2008/0308876 | A1 | 12/2008 | Lee et al. |
| 2009/0050955 | A1 | 2/2009 | Akita et al. |
| 2009/0065845 | A1 | 3/2009 | Kim et al. |
| 2009/0072274 | A1 | 3/2009 | Knoefler et al. |
| 2009/0078986 | A1 | 3/2009 | Bach |
| 2009/0101961 | A1 | 4/2009 | He et al. |
| 2009/0111229 | A1 | 4/2009 | Steimle et al. |
| 2009/0179283 | A1 | 7/2009 | Adams et al. |
| 2009/0225602 | A1 | 9/2009 | Sandhu et al. |
| 2009/0256211 | A1 | 10/2009 | Booth, Jr. et al. |
| 2009/0269893 | A1 | 10/2009 | Hashimoto et al. |
| 2009/0273013 | A1 | 11/2009 | Winstead et al. |
| 2009/0278187 | A1 | 11/2009 | Toba |
| 2011/0031548 | A1 | 2/2011 | White et al. |
| 2011/0095348 | A1 | 4/2011 | Chakihara et al. |
| 2011/0204450 | A1 | 8/2011 | Moriya |
| 2011/0260258 | A1 | 10/2011 | Zhu et al. |
| 2012/0034751 | A1 | 2/2012 | Ariyoshi et al. |
| 2012/0104483 | A1 | 5/2012 | Shroff et al. |
| 2012/0132978 | A1 | 5/2012 | Toba et al. |
| 2012/0142153 | A1 | 6/2012 | Jeong |
| 2012/0248523 | A1 | 10/2012 | Shroff et al. |
| 2012/0252171 | A1 * | 10/2012 | Shroff et al. .................. 438/129 |
| 2013/0026553 | A1 | 1/2013 | Horch |
| 2013/0037886 | A1 | 2/2013 | Tsai et al. |
| 2013/0065366 | A1 | 3/2013 | Thomas et al. |
| 2013/0084684 | A1 | 4/2013 | Ishii et al. |
| 2013/0137227 | A1 | 5/2013 | Shroff et al. |
| 2013/0171785 | A1 | 7/2013 | Shroff et al. |
| 2013/0171786 | A1 | 7/2013 | Shroff et al. |
| 2013/0178027 | A1 | 7/2013 | Hall et al. |
| 2013/0178054 | A1 | 7/2013 | Shroff et al. |
| 2013/0264633 | A1 | 10/2013 | Hall et al. |
| 2013/0264634 | A1 | 10/2013 | Hall et al. |
| 2013/0267072 | A1 | 10/2013 | Hall et al. |
| 2013/0267074 | A1 | 10/2013 | Hall et al. |
| 2013/0323922 | A1 | 12/2013 | Shen et al. |
| 2014/0035027 | A1 | 2/2014 | Chakihara et al. |
| 2014/0050029 | A1 | 2/2014 | Kang et al. |
| 2014/0120713 | A1 | 5/2014 | Shroff et al. |
| 2014/0227843 | A1 | 8/2014 | Tsukamoto et al. |
| 2015/0054044 | A1 | 2/2015 | Perera et al. |

OTHER PUBLICATIONS

Notice of Allowance mailed Jan. 22, 2015 for U.S. Appl. No. 13/790,004, 11 pages.

Office Action mailed Feb. 12, 2015 for U.S. Appl. No. 13/971,987, 7 pages.

Office Action mailed Dec. 4, 2014 for U.S. Appl. No. 13/972,372, 5 pages.

U.S. Appl. No. 14/291,359, filed May 30, 2014, entitled Split Gate Nanocrystal Memory Integration.

U.S. Appl. No. 13/972,372, filed Aug. 21, 2013, entitled "Integrated Split Gate Non-Volatile Memory Cell and Logic Device".

U.S. Appl. No. 13/971,987, filed Aug. 21, 2013, entitled "Integrated Split Gate Non-Volatile Memory Cell and Logic Structure".

U.S. Appl. No. 13/969,180, Perera, Office Action—Allowance, mailed Aug. 5, 2014.

U.S. Appl. No. 13/781,727, Shroff, Office Action—Allowance, mailed Aug. 15, 2014.

U.S. Appl. No. 13/955,665, Office Action—Allowance, mailed Aug. 20, 2014.

U.S. Appl. No. 13/973,549, Hong, Office Action—Restriction, mailed Aug. 26, 2014.

U.S. Appl. No. 13/441,426, Shroff, Office Action—Allowance, mailed Sep. 26, 2014.

U.S. Appl. No. 13/661,157, Office Action—Restriction, mailed Oct. 2, 2014.

(56) References Cited

OTHER PUBLICATIONS

U.S. Appl. No. 14/041,662, Perera, Office Action—Allowance, mailed Oct. 17, 2014.
U.S. Appl. No. 13/973,549, Hong, Office Action—Allowance, mailed Nov. 14, 2014.
U.S. Appl. No. 13/441,426, Shroff, M., et al., "Non-Volatile Memory (NVM) and Logic Integration", Office Action—Allowance, Feb. 21, 2014.
U.S. Appl. No. 13/907,491, Hall et al., "Logic Transistor and Non-Volatile Memory Cell Integration", Office Action—Allowance, mailed Mar. 11, 2014.
U.S. Appl. No. 13/790,225, Hall et al., "Integrating Formation of a Replacement Gate Transistor and a Non-Volatile Memory Cell Having Thin Film Storage", Office Action—Allowance, mailed Mar. 12, 2014.
U.S. Appl. No. 13/781,727, Office Action—Allowance, May 12, 2014.
U.S. Appl. No. 13/441,426, Shroff, M. D., et al., Office Action—Allowance, mailed Feb. 21, 2014.
U.S. Appl. No. 13/441,426, Shroff, M. D., et al., Office Action—Allowance, mailed Jun. 9, 2014.
U.S. Appl. No. 13/780,591, Hall, M.D., et al., Office Action—Allowance, mailed May 12, 2014.
U.S. Appl. No. 13/928,666, Hong, C.M. et al., Office Action—Rejection, mailed Jul. 23, 2014.
U.S. Appl. No. 14/041,662, Perera, A.H., et al., Office Action—Restriction, mailed Aug. 1, 2014.
U.S. Appl. No. 13/907,491, Hall, Mark D., et al., Office Action—Restriction, mailed Sep. 3, 2013.
U.S. Appl. No. 13/491,771, Hall et al., Integrating Formation of a Replacement Gate Transistor and a Non-Volatile Memory Cell Using a High-K Dielectric, Office Action—Allowance, mailed Jan. 16, 2014.
U.S. Appl. No. 13/491,771, Hall et al., Integrating Formation of a Replacement Gate Transistor and a Non-Volatile Memory Cell Using a High-K Dielectric, Office Action—Allowance, mailed Mar. 6, 2014.
U.S. Appl. No. 13/442,142, Hall, M.D., et al., "Logic Transistor and Non-Volatile Memory Cell Integration", Office Action—Allowance, Dec. 31, 2013.
U.S. Appl. No. 13/442,142, Hall, M.D., et al., "Logic Transistor and Non-Volatile Memory Cell Integration", Office Action—Allowance, Feb. 28, 2014.
U.S. Appl. No. 13/790,225, Hall, M., et al., "Integrating Formation of a Replacement Gate Transistor and a Non-Volatile Memory Cell Having Thin Film Storage", Office Action—Allowance, mailed Dec. 24, 2013.
U.S. Appl. No. 13/790,014, Hall, M., et al., "Integrating Formation of a Logic Transistor and a Non-Volatile Memory Cell Using a Partial Replacement Gate Technique", Office Action—Allowance, mailed Dec. 24, 2013.
U.S. Appl. No. 13/790,014, Hall, M., et al., "Integrating Formation of a Logic Transistor and a Non-Volatile Memory Cell Using a Partial Replacement Gate Technique", Office Action—Allowance, mailed Mar. 3, 2014.
U.S. Appl. No. 13/781,727, Shroff, M., et al., "Methods of Making Logic Transistors and Non-Volatile Memory Cells", Office Action—Allowance, mailed Jan. 31, 2014.
U.S. Appl. No. 13/343,331, Shroff, M., et al., "Non-Volatile Memory (NVM) and Logic Integration", Office Action—Allowance, Nov. 8, 2013.
U.S. Appl. No. 13/441,426, Shroff, M., et al., "Non-Volatile Memory (NVM) and Logic Integration", Office Action—Allowance, Dec. 21, 2013.
U.S. Appl. No. 13/780,574, Hall, M., et al., "Non-Volatile Memory (NVM) and Logic Integration", Office Action—Allowance, mailed Dec. 24, 2013.
U.S. Appl. No. 13/780,591, Hall, M., et al., "Non-Volatile Memory (NVM) and Logic Integration", Office Action—Allowance, mailed Nov. 22, 2013.

Chen, J.H., et al., "Nonvolatile Flash Memory Device Using Ge Nanocrystals Embedded in HfA1O High-k Tunneling and Control Oxides: Device Fabrication and Electrical Performance", IEEE Transactions on Electron Devices, vol. 51, No. 11, Nov. 2004, pp. 1840-1848.
Kang, T.K., et al., "Improved characteristics for Pd nanocrystal memory with stacked HfAlO-SiO2 tunnel layer", Sciencedirect.com, Solid-State Electronics, vol. 61, Issue 1, Jul. 2011, pp. 100-105, http://wwww.sciencedirect.com/science/article/pii/S0038110111000803.
Krishnan, S., et al.., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1.4, pp. 634-637.
Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.
Liu, Z., et al., "Metal Nanocrystal Memories—Part I: Device Design and Fabrication", IEEE Transactions on Electron Devices, vol. 49, No. 9, Sep. 2002, pp. 1606-1613.
Mao, P., et al., "Nonvolatile memory devices with high density ruthenium nanocrystals", Applied Physics Letters, vol. 93, Issue 24, Electronic Transport and Semiconductors, 2006.
Mao, P., et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.
Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.
Wang, X.P., et al., Dual Metal Gates with Band-Edge Work Functions on Novel HfLaO High-K Gate Dielectric, IEEE, Symposium on VLSI Technology Digest of Technical Papers, 2006.
U.S. Appl. No. 13/402,426, Hall, M.D., et al., "Non-Volatile Memory Cell and Logic Transistor Integration", Office Action—Allowance—May 3, 2013.
U.S. Appl. No. 13/789,971, Hall, M.D., et al, "Integration Technique Using Thermal Oxide Select Gate Dielectric for Select Gate and Replacement Gate for Logic", Office Action—Allowance—May 15, 2013.
U.S. Appl. No. 13/491,771, Hall et al, "Integrating Formation of a Replacement Ggate Transistor and a Non-Volatile Memory Cell Using a High-K Dielectric", Office Action—Rejection, Sep. 9, 2013.
U.S. Appl. No. 13/442,142, Hall, M.D., et al., "Logic Transistor and Non-Volatile Memory Cell Integration", Office Action—Ex Parte Quayle, Apr. 4, 2013.
U.S. Appl. No. 13/442,142, Hall, M.D., et al., "Logic Transistor and Non-Volatile Memory Cell Integration", Office Action—Allowance, Aug. 2, 2013.
U.S. Appl. No. 13/907,491, Hall, M.D., et al., "Logic Transistor and Non-Volatile Memory Cell Integration", Office Action—Rejection, Sep. 13, 2013.
U.S. Appl. No. 12/915,726, Shroff, M., et al., "Non-Volatile Memory and Logic Circuit Process Integration", Office Action—Restriction, Jul. 31, 2012.
U.S. Appl. No. 12/915,726, Shroff, M., et al., "Non-Volatile Memory and Logic Circuit Process Integration", Office Action—Allowance, Dec. 10, 2012.
U.S. Appl. No. 13/781,727, Shroff, M., et al., "Methods of Making Logic Transistors and Non-Volatile Memory Cells", Office Action—Rejection, Aug. 22, 2013.
U.S. Appl. No. 13/077,491, Shroff, M.., et al., "Non-Volatile Memory and Logic Circuit Process Integration", Office Action—Rejection, Aug. 15, 2012.
U.S. Appl. No. 13/077,491, Shroff, M.., et al., "Non-Volatile Memory and Logic Circuit Process Integration", Office Action—Rejection, Feb. 6, 2013.
U.S. Appl. No. 13/077,491, Shroff, M.., et al.., "Non-Volatile Memory and Logic Circuit Process Integration", Office Action—Allowance, Jun. 18, 2013.

(56) References Cited

OTHER PUBLICATIONS

U.S. Appl. No. 13/077,501, Shroff, M.., et al.., "Non-Volatile Memory and Logic Circuit Process Integration", Office Action—Allowance, Nov. 26, 2012.
U.S. Appl. No. 13/313,179, Shroff, M., et al., "Method of Protecting Against Via Failure and Structure Therefor", Office Action—Rejection, Aug. 15, 2013.
U.S. Appl. No. 13/307,719, Shroff, M., et al., "Logic and Non-Volatile Memory (NVM) Integration", Office Action—Allowance, May 29, 2013.
U.S. Appl. No. 13/343,331, Shroff, M., et al., "Non-Volatile Memory (NVM) and Logic Integration", Office Action—Rejection, Mar. 13, 2013.
U.S. Appl. No. 13/343,331, Shroff, M., et al., "Non-Volatile Memory (NVM) and Logic Integration", Office Action—Allowance, Jun. 24, 2013.
U.S. Appl. No. 13/441,426, Shroff, M., et al., "Non-Volatile Memory (NVM) and Logic Integration", Office Action—Allowance, Sep. 9, 2013.
U.S. Appl. No. 13/780,574, Hall, M.D., et al., Non-Volatile Memory (NVM) and Logic Integration, Office Action—Allowance, Sep. 6, 2013.
U.S. Appl. No. 13/491,760, Shroff, M.., et al., "Integrating Formation of a Replacement Gate Transistor and a Non-Volatile Memory Cell Using an Interlayer Dielectric", Office Action—Allowance, Jul. 1, 2013.
U.S. Appl. No. 13/491,771, Hall, M., et al., "Integrating Formation of a Replacement Gate Transistor and a Non-Volatile Memory Cell Using a High-K Dielectric", filed Jun. 8, 2012.
U.S. Appl. No. 13/790,225, Hall, M., et al., "Integrating Formation of a Replacement Gate Transistor and a Non-Volatile Memory Cell Having Thin Film Storage", filed Mar. 8, 2013.
U.S. Appl. No. 13/790,014, Hall, M., et al., "Integrating Formation of a Logic Transistor and a None-Volatile Memory Cell Using a Partial Replacement Gate Technique", filed Mar. 8, 2013.
U.S. Appl. No. 13/955,665, Perera, A.H., "Non-Volatile Memory (NVM) and High K and Metal Gate Integration Using Gate First Methodology", filed Jul. 31, 2013.
U.S. Appl. No. 13/928,666, Hong, C. M., et al., "Non-Volatile Memory (NVM) and High Voltage Transistor Integration", filed Jun. 27, 2013.
U.S. Appl. No. 13/780,591, Hall, M.D., et al., "Non-Volatile Memory (NVM) and Logic Integration", filed Feb. 28, 2013.
U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.
U.S. Appl. No. 13/661,157, Shroff, M.D., et al., "Method of Making a Logic Transistor and a Non-Volatile Memory (NVM) Cell", filed Oct. 26, 2012.
U.S. Appl. No. 13/781,727, Shroff, M., et al., "Methods of Making Logic Transistors and non-Volatile Memory Cells", Office Action—Restriction, Jun. 21, 2013.
Notice of Allowance mailed Mar. 30, 2015 for U.S. App. No. 13/790,004, 5 pages.
Notice of Allowance mailed Apr. 27, 2015 for U.S. Appl. No. 13/971,987, 12 pages.
First Action Interview Office Action mailed May 22, 2015 for U.S. Appl. No. 13/972,372, 12 pages.
Restriction Requirement mailed May 14, 2015 for U.S. Appl. No. 14/291,359, 8 pages.

* cited by examiner

US 9,082,837 B2

NONVOLATILE MEMORY BITCELL WITH INLAID HIGH K METAL SELECT GATE

BACKGROUND OF THE INVENTION

1. Field of the Invention

The present invention is directed in general to integrated circuit devices and methods for manufacturing same. In one aspect, the present invention relates to the fabrication of CMOS metal gate devices and non-volatile memory devices integrated on a single substrate or chip.

2. Description of the Related Art

Non-volatile memory devices, such as EEPROM and flash memory, are used in computers and other electronic devices to store data and/or programming instructions that can be electrically erased and reprogrammed and that must be saved when power is removed. Embedded non-volatile memory (NVM) has become increasingly important in applications ranging from data and code storage to circuit trimming and customization. By embedding a non-volatile memory in a CMOS device, a single chip device can be manufactured and configured for a variety of applications. While the introduction of novel gate stack materials for forming high-k metal gate stacks using gate last processes has improved device performance and reduced feature sizes for transistor devices, there are a number of integration options and challenges associated with the integration of such novel materials with existing polysilicon nanocrystal thin film storage bitcells. For example, as the dimensions of transistors decrease, the height of the conventional gate stacks used to form NVM bitcells has been reduced to prevent the "gate last" processing steps from damaging the NVM bitcell gates.

BRIEF DESCRIPTION OF THE DRAWINGS

The present invention may be understood, and its numerous objects, features and advantages obtained, when the following detailed description is considered in conjunction with the following drawings, in which.

Figure 1:
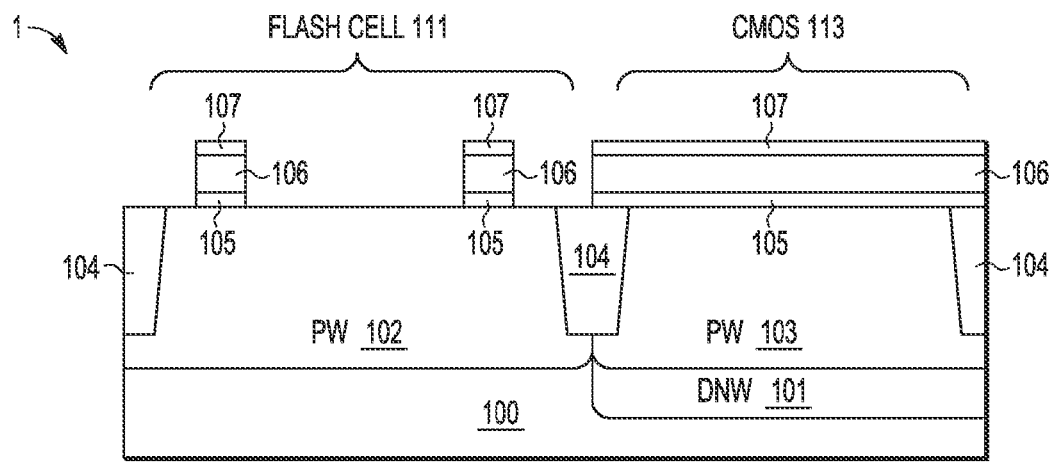
FIGS. 1-9 show an example semiconductor device during successive phases of a fabrication sequence in which split-gate thin film storage non-volatile memory bitcells are integrated with a gate-last process used to form NMOS and PMOS high-k metal gate transistors.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A compact split-gate nanocrystal thin film storage (TFS) non-volatile memory (NVM) bitcell integrated with high-k metal gate (HKMG) transistors and associated fabrication process are disclosed in which the NVM bitcells are formed with a recessed control gate and an HKMG select gate that is formed along with non-NVM HKMG transistor gates using a CMOS gate-last fabrication sequence to enable the co-existence of embedded flash and HKMG transistors on the same wafer. After patterning a poly layer over an NVM area with a first gate pattern to define one or more sacrificial poly select gates, an adjacent nanocrystal stack and recessed control gate are formed next to each sacrificial poly select gate in the NVM area, thereby forming one or more split-gate nanocrystal TFS NVM bitcells. The poly layer is subsequently patterned over a non-NVM area with a second gate pattern to define one or more sacrificial poly transistor gates in the non-NVM area. Using a shared gate-last process sequence, the sacrificial poly select gate(s) and poly transistor gate(s) may be replaced with high-k metal gates having enhanced isolation between the high-k metal select gate and recessed control gate. Selected embodiments of the disclosed integration scheme fabricate the control gate by depositing a polysilicon layer over a previously-formed poly select gate electrode, nanocrystal stack layer, and barrier metal layer, and then polishing and recessing the polysilicon layer with a chemical mechanical polish step, alone or in combination with a recess etch step, thereby forming TFS bitcells in an NVM area. Subsequently, a polysilicon layer formed over a non-NVM area is patterned and etched to form sacrificial NMOS and PMOS transistor gate electrodes. Using a gate-last high-k metal gate process, the poly select gate electrode and sacrificial NMOS and PMOS transistor gate electrodes are replaced with high-k metal gate electrodes. In selected embodiments, the high-k metal gate transistors are formed by removing poly layers from the poly select gate electrode and sacrificial NMOS and PMOS transistor gate electrodes to form gate electrode openings that leave or expose the barrier metal layer formed over a high-k gate dielectric layer that was previously formed, and then forming one or more metal gate layers in the gate electrode openings. In other embodiments, the high-k metal gate electrodes are formed by removing the poly select gate electrode and sacrificial NMOS and PMOS transistor gate electrodes (including underlying gate dielectric layers) to form gate electrode openings that expose the substrate, and then forming the high-k metal gate electrodes by depositing or forming high-k gate dielectric and metal gate layers in the gate electrode openings.

In this disclosure, an improved system, apparatus, and fabrication method are described for fabricating embedded non-volatile memory devices on-chip with CMOS metal-gate transistors using a gate-last process that address various problems in the art where various limitations and disadvantages of conventional solutions and technologies will become apparent to one of skill in the art after reviewing the remainder of the present application with reference to the drawings and detailed description provided herein. For example, there are challenges with combining non-volatile memory (such as flash EEPROM) into a standard CMOS process flow, especially as CMOS technology is increasingly replacing silicon dioxide gate dielectrics and polysilicon gate conductors with high dielectric constant (high-k) dielectrics in combination with metal gate electrodes formed with one or more metal layers to form high-k metal gate (HKMG) electrode stacks. With some existing HKMG fabrication processes, there are challenges with integrating a split-gate TFS bitcell into a gate last technology that is used to form the HKMG electrodes. For example, in a gate-last process where wafer planarization is applied to expose transistors formed using a sacrificial poly silicon gate to implement an inlaid or damascene method of forming HKMG gates, non-volatile memory designs which use a double-high gate stack in the split-gate NVM bitcell (e.g., due to overlap of the control gate on part of the select gate transistor) would be destroyed during the wafer planarization step. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

FIG. 1 is a partial cross-sectional view of a first example semiconductor device or structure 1 formed on a substrate 100 which includes a flash memory cell area 111 and CMOS transistor area 113. Though the various structures, well, and layer regions are illustrated in simplified form with straight lines and curved or corner regions, it will be appreciated that the actual profile(s) for the different structures, well, and layer regions will not necessarily conform to simplified depictions, but will instead depend on the specific fabrication process(es) used. For example, the various well regions may have a curved junction profile reflecting the implantation and heating steps used in the formation of same. In addition, the depicted device structures may be formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++). As described below, one or more split-gate thin film storage non-volatile memory bitcells (e.g., flash high voltage transistors and/or flash memory cells) may be formed in the flash memory cell area 111, such as by forming scaled TFS bitcells in the flash memory cell area 111 with recessed control gates and sacrificial in-laid poly select gates. Subsequently, a gate last process (a.k.a., a replacement gate method) is used to form high-k dielectric metal gate (HKMG) electrodes for the select gates and CMOS transistor gates.

In the semiconductor structure 1, the depicted substrate 100 may be formed as a bulk semiconductor substrate or other substrate in which one or more additional semiconductor layers and/or well regions are formed using epitaxial semiconductor growth and/or selective doping techniques as described more fully hereinbelow. For example, the substrate 100 may be a semiconductor-on-insulator (SOI) type substrate which includes a semiconductor substrate, buried insulator layer formed over the substrate, and p-type semiconductor substrate layer formed over the buried insulator or oxide layer (not shown). Alternatively and depending on the type of transistor being fabricated, the semiconductor substrate 100 may be implemented as a bulk silicon substrate, single crystalline silicon (doped or undoped), SOI substrate, or any semiconductor material including, for example, Si, SiC, SiGe, SiGeC, Ge, GaAs, InAs, InP, as well as other III/V or II/VI compound semiconductors or any combination thereof.

In an upper portion of the substrate 100, a plurality of shallow trench isolation (STI) structures 104 are formed that divide the substrate 100 into separate regions, such as a flash memory cell area 111 and a CMOS device region 113. Thus, the STI structures 104 define lateral boundaries of different regions 111, 113, and may be formed using any desired technique, such as selectively etching an opening in the substrate 100 using a patterned mask or photoresist layer (not shown), depositing a dielectric layer (e.g., oxide) to fill the opening, and then polishing the deposited dielectric layer until planarized with the remaining substrate 100. Any remaining unetched portions of the patterned mask or photoresist layer(s) are stripped. As will be appreciated, the STI structures 104 may be formed in other ways in other embodiments.

In each of the defined regions 111, 113, upper portions of substrate 100 include active substrate layers 102, 103 between the STI regions 104 that may be doped differently, depending on whether the transistors formed in each area are n-type or p-type devices. For example, the active substrate layers in the CMOS region 113 where NMOS transistors are formed may be implanted with impurities of a first conductivity type (e.g., p-type impurities, such as boron) to form a p-well region 103, where the masking, implantation energy, dosage, and profile for the p-well region 103 are suitable for the formation of NMOS transistors. To isolate the active substrate layers in the CMOS region 113, the substrate 100 may also include a deep well region of a second, opposite polarity type formed under the p-well region 103, such as by selectively implanting or diffusing n-type impurities (e.g., arsenic or phosphorus) to form the deep n-well region 101, where the masking, implantation energy, dosage, and profile for the n-well region 101 are controlled to place the deep n-well region 101 below the p-well region 103. Though not shown, it will be appreciated that the polarity of the well regions 101, 103 may be reversed for the active substrate layers in the CMOS region 113 where PMOS transistors are formed, thereby forming an n-well region at an upper portion of substrate 100 (not shown), alone or in combination with an deep p-well region (not shown). In similar fashion, the active substrate layers in the flash cell device region 111 where n-type flash cells are formed may be implanted with p-type impurities to form an array well region 102 of a first conductivity type (e.g., p-well), where the masking, implantation energy, dosage, and profile for the p-well region 102 are suitable for the formation of NMOS flash cells. Again, the polarity of the array well region 102 may be reversed (e.g., to n-type) for the active substrate layers in the flash cell device region 111 where PMOS transistors are formed.

In flash memory cell area 111 of the semiconductor structure 1, one or more split-gate nanocrystal TFS NVM bitcell structures may be formed with one or more recessed control gates and an in-laid HKMG select gate using any desired processing steps. By way of providing a non-limiting example of processing steps that may be used, one or more gate dielectric layers 105 may be formed over the entirety of the substrate 100 and STI structures 104, such as by growing or depositing a base dielectric layer of silicon dioxide or other suitable gate dielectric material to a predetermined gate dielectric thickness. For example, a base dielectric layer may be selectively formed over the flash cell array well region 102, such as by thermally growing an oxide layer and/or depositing an oxide with a low pressure chemical vapor deposition (LPCVD) high temperature oxide (HTO) to a predetermined thickness (e.g., approximately 5-50 Angstroms), though other materials or thicknesses may be used. In this setting, the selective formation of the base dielectric layer may involve forming a photoresist etch mask over the flash cell array well region 102 so that the base dielectric layer may be etched or otherwise removed from the CMOS well region 103. After selectively forming the base dielectric layer over the flash cell array well region 102, a high-k dielectric layer may be formed to a predetermined gate dielectric thickness over the semiconductor structure 1, alone or in combination with a deposited barrier metal layer. In selected embodiments, the high-k dielectric layer may be formed by depositing a high-k gate dielectric material with a relatively high dielectric constant value on top of the base dielectric layer using chemical vapor deposition (CVD), plasma-enhanced chemical vapor deposition (PECVD), physical vapor deposition (PVD), atomic layer deposition (ALD), or any combination(s) of the above. In selected embodiments, the high-k dielectric layer may be formed by a low temperature CVD or ALD process to a predetermined final thickness in the range of 1-100 Angstroms (e.g., 15-25 Angstroms), though other thicknesses may be used. A suitable high-k gate dielectric material for the high-k dielectric layer is an insulator material having a dielectric constant value k of 7.0 or greater, including a hafnium-based dielectric such hafnium silicate (e.g., $Hf_xSi_{1-x}O_y$) or hafnium oxy-nitride (e.g., $Hf_xSi_{1-x}O_yN_z$), though other silicates of zirconium, aluminum, lanthanum, strontium, tantalum, titanium and combinations thereof may also be used, including but not limited to $HfSiO_X$, $ZrSiO_X$, $LaSiO_X$, $YSiO_X$, $ScSiO_X$, $CeSiO_X$, and $HfLaSiO_X$. In addition, multi-metallic oxides (for example barium strontium titanate, BST) may also provide high-k dielectric properties. A suitable temperature for the deposition process is in the range of approximately 200 degrees Celsius to approximately 400 degrees Celsius.

On the gate dielectric layer(s) 105, one of more select gate conductor layers 106 may be formed, such as by blanket-depositing a layer of barrier metal to a thickness of approximately 50-200 Angstroms followed by a layer of polysilicon or SiGe over the gate dielectric layer(s) 105 by using CVD, PECVD, PVD, ALD, or any combination(s) thereof to a thickness of approximately 500-2000 Angstroms, though thinner or thicker layers may also be used. The select gate conductor layers 106 may be deposited as a doped poly layer, or may be subsequently doped with appropriate impurities to make the select gate layer 106 conductive. If desired, a gate cap layer 107 may be formed to cover the conductive select gate layer(s) 106, such as by depositing an oxide layer, alone or in combination with an additional nitride/oxide layer stack. The gate cap layer 107, conductive select gate layer(s) 106, and underlying gate dielectric layers 105 may be patterned and anisotropically etched to form the select gate electrode stacks 105-107 for the TFS NVM bitcell structures in the flash cell device region 111, while leaving an unetched gate stack 105-107 over the CMOS region 113. As will be appreciated, any desired gate patterning and etch sequence may be used to form the patterned select gate electrode stacks 105-107, including but not limited to photoresist or a hard mask formation, TEOS etch (using the photoresist as a mask), ARC etch (using the remnant TEOS as a mask), pre-etch cleaning, oxide break through, main poly plasma etch, soft landing etch, poly clean overetch, and post-etch cleaning. As part of the select gate pattern etch sequence, the exposed select gate dielectric layer(s) 105 may also be cleared from the surface of the substrate 100.

Figure 2:
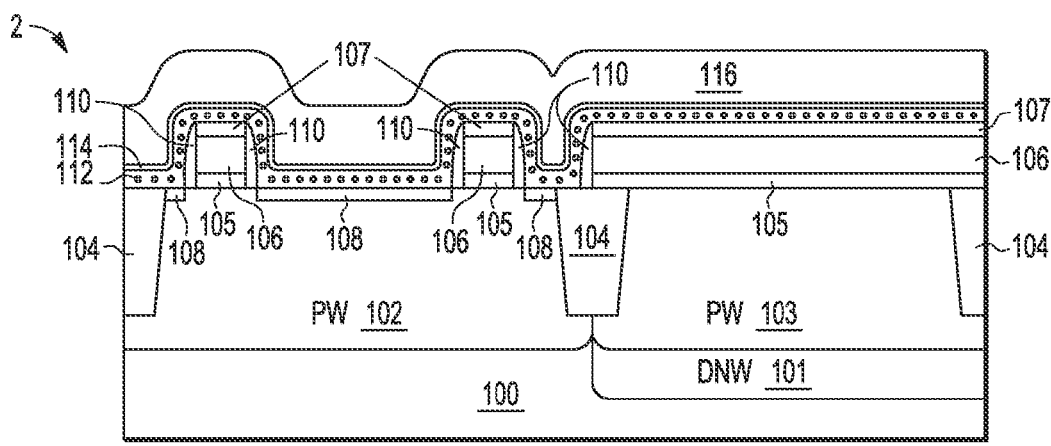

FIG. 2 illustrates processing of the semiconductor structure 2 subsequent to FIG. 1 after counter-doping control gate channel regions 108 and sequentially forming a charge storage layer 112, control gate barrier metal layer 114, and control gate poly layer 116 over the at least the patterned select gate electrode stacks 105-107. As an initial step, any etch mask or photoresist layers are stripped or removed from the patterned select gate electrode stacks 105-107 to expose the control gate channel areas in the array well region 102 where one or more counter-doped control gate channel regions 108 may be formed by implanting impurities around the select gate electrode stacks 105-107 and any implant masks using conventional implanting processes to implant ions having a predetermined conductivity type. For example, if the flash cell area 111 is intended for N channel operation, the first doped region 108 is counter-doped with arsenic, phosphorous or another appropriate n-type dopant by selectively masking off the remainder of the substrate 100 from implantation. Conversely, if the flash cell 111 is intended for P channel operation, the first doped region 108 is lightly implanted with boron, indium or another appropriate p-type dopant by selectively masking off the remainder of the substrate 100 from implantation. If desired, offset spacers 110 may be formed on the sidewalls of the select gate electrode stacks 105-107 prior to implanting the doped region(s) 108, such as by depositing one or more suitable dielectric layer(s) over the select gate electrode stacks 105-107 and then anisotropically etching the dielectric layer(s) to form the offset spacers 110.

After counter-doping the control gate channel regions 108, a charge storage layer 112 is selectively formed over the semiconductor structure 2, including the top and side surface of the patterned select gate electrode stacks 105-107 and the control gate channel regions 108. While any desired charge storage layer sequence may be used, in selected example embodiments, the charge storage layer 112 may be formed by forming an insulating layer over the substrate 100 and patterned select gate electrode stacks 105, 106, such as by depositing a high-k dielectric layer or other appropriate insulating layer to a predetermined thickness (e.g., approximately 40-150 Angstroms), though other thicknesses may be used. On the insulating layer, a layer of conductive nanocrystals may be formed, where the nanocrystals having predetermined diameters (e.g., approximately 3-10 nanometers) and spacing (e.g., about 5 nanometers apart). After depositing the nanocrystals, an insulating layer is formed over and around the nanocrystals, such as by depositing a suitable high-k dielectric with a low pressure chemical vapor deposition (LPCVD) to a predetermined thickness (e.g., approximately 100-200 Angstroms), though other materials or thicknesses may be used.

After forming the charge storage layer 112 over the substrate 100, one of more control gate conductor layers 114, 116 may be formed over the semiconductor structure 2. As a preliminary step, a control gate barrier metal layer 114 may be deposited on the charge storage layer 112, such as by depositing titanium nitride using CVD, PECVD, PVD, ALD, or any combination(s) thereof to a predetermined thickness of approximately 50-150 Angstroms, though other materials or thicknesses may be used. Next, a control gate layer 116 may be formed on the control gate barrier metal layer 114, such as by blanket-depositing a layer of polysilicon or SiGe using CVD, PECVD, PVD, ALD, or any combination(s) thereof to a thickness of approximately 500-2000 Angstroms, though a thinner or thicker layer may also be used. When formed as a control gate poly layer 116, the thickness of the control gate poly layer 116, alone or in combination with the control gate barrier metal layer 114, is sufficient to completely fill the openings formed between the patterned select gate electrode stacks 105-107. The control gate layer 114 may be deposited as a doped poly layer, or may be subsequently doped with appropriate impurities to make the control gate layer 114 conductive.

Figure 3:
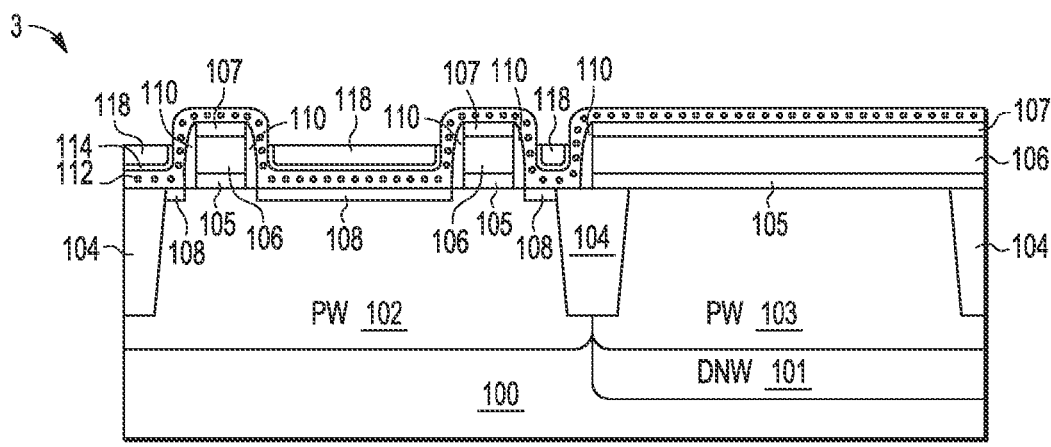

FIG. 3 illustrates processing of the semiconductor structure 3 subsequent to FIG. 2 after forming a recessed control gate layer 118 from the control gate poly layer 116. In selected embodiments, the recessed control gate layer 118 may be formed by applying a planarization step (e.g., a chemical mechanical polish step) to form a polished control gate poly layer (not shown) having a top surface that is substantially co-planar with the top of the charge storage layer 112 or even lower, depending on the extent of the planarization step. In addition or in the alternative, one or more recess etch processes may be applied to the polished control gate poly layer to form the recessed control gate layer 118. While any recess etch process may be used, the recessed control gate layer 118 may be formed by applying a dry etch, such as a reactive ion etch process, to recess the polished control gate without removing or substantially etching the charge storage layer 112. After the control gate recess etch sequence, the recessed control gate layer 118 may have a top surface that is recessed below the top of the select gate conductor layer 106.

Figure 4:
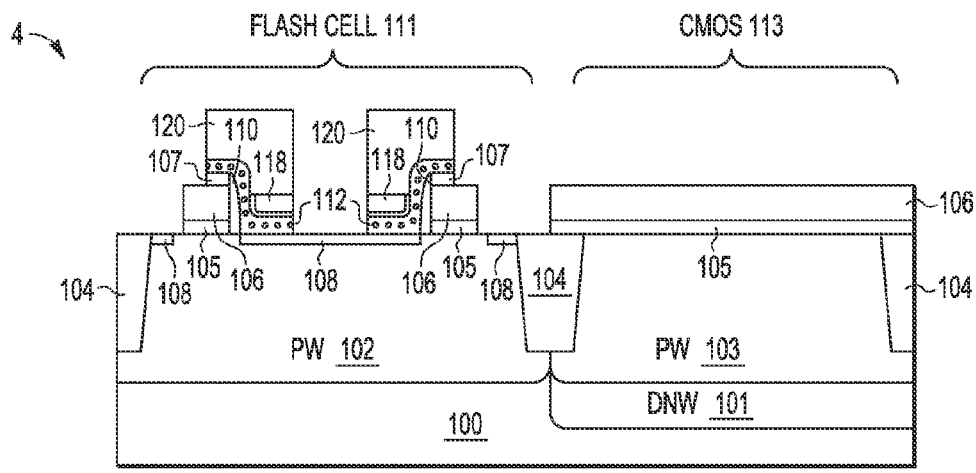

FIG. 4 illustrates processing of the semiconductor structure 4 subsequent to FIG. 3 after a patterned etch mask 120 in the flash cell device region 111 is used to selectively etch the charge storage layer 112 and recessed control gate layer 118 to form split-gate electrodes 106, 112, 118. In particular, the recessed control gate layer 118 and charge storage layer 112 may be anisotropically etched with the patterned photoresist layer or etch mask 120 using any desired etch sequence, including but not limited to patterned photoresist in combination with one or more anisotropic etch processes. As depicted, the etch process(es) used to selectively etch the charge storage layer 112 and unprotected recessed control gate layer 118 may be designed with a selective etch chemistry that removes any unmasked portions of the charge storage layer 112 and unprotected recessed control gate layer 118, while leaving substantially intact the underlying select gate conductor layers 106 and capping dielectric layers 107. To remove the unmasked portion of the capping dielectric layers 107 and offset spacers 110, a separate etch process (e.g., wet etch) may be applied before removing the patterned etch mask 120. With these processes, the charge storage layer 112 and capping dielectric layers 107 may also be removed from the gate conductor layer 106 in the CMOS region 113.

Figure 5:
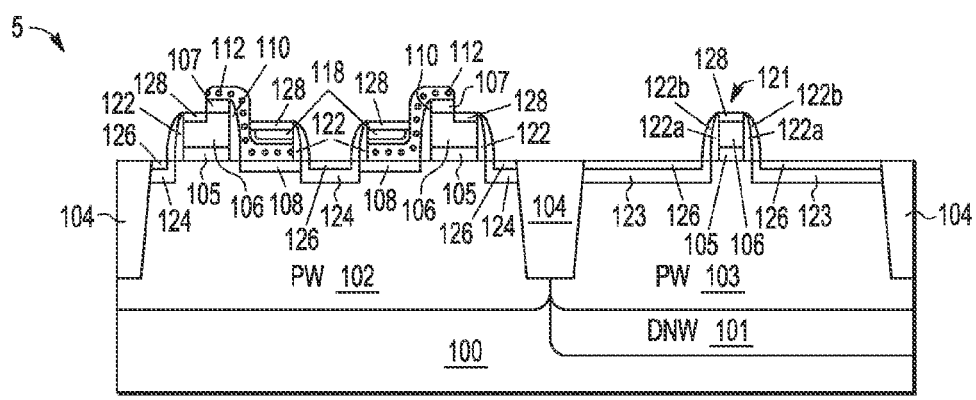

FIG. 5 illustrates processing of the semiconductor structure 5 subsequent to FIG. 4 after forming one or more sacrificial gate electrodes 121 in the CMOS region 113 along with sidewall spacers 122 and silicided regions 126, 128 on the source/drain regions 123, 124 and on the poly gate layers 106 of the split-gate electrodes 106, 112, 118 and sacrificial gate electrodes 121. As a preliminary step to forming the sacrificial gate electrodes 121, a protective mask (not shown) is formed over the flash cell device region 111 to cover and protect the split-gate electrodes 106, 112, 118, such as by selectively forming a nitride or silicon oxide layer over the flash cell device region 111 to expose the CMOS region 113. With the protective mask in place, the one or more sacrificial gate electrodes 121 may be formed from the unetched gate stack layers 105-106 over the CMOS region 113 for use with any desired transistor (e.g., low voltage transistors, dual gate transistors, high voltage transistors, or the like) using any desired pattern and etch sequence. For example, by forming a patterned etch mask or photoresist layer (not shown) to anisotropically etch the gate conductor layer 106 and underlying high-k gate dielectric layer(s) 105, one or more sacrificial gate electrode(s) 121 may be formed over the p-well region 103 in the CMOS region 113. As will be appreciated, any desired gate patterning and etch sequence may be used to form the sacrificial gate electrodes 121, including but not limited to photoresist or a hard mask formation, TEOS etch (using the photoresist as a mask), ARC etch (using the remnant TEOS as a mask), pre-etch cleaning, oxide break through, main poly plasma etch, soft landing etch, poly clean overetch, and post-etch cleaning.

After stripping or removing the patterned etch mask or photoresist layer and protective mask, sidewall spacers 122 are formed and used to form self-aligned silicide source/drain regions 123, 124, 126 around the split-gate NVM bitcell electrodes 106, 118 and sacrificial gate electrodes 121. For example, a first set of sidewall offset spacers 122a may be formed on the sidewalls of the split-gate electrodes 106, 118 and sacrificial gate electrodes 121 prior to source/drain implantation, such as by depositing a first dielectric layer (e.g., depositing silicon dioxide or nitride) over the semiconductor structure 5 to cover the split-gate electrodes 106, 118 and sacrificial gate electrodes 121 and then anisotropically etching the oxide layer to form the offset spacers 122a. The offset spacers 122a may be used in combination with one or more patterned implant masks (not shown) to form halo or extension implant regions 123, 124 by implanting appropriate polarity dopants, such as n-type halo/extension regions for NMOS transistor devices or p-type halo/extension regions for PMOS transistor devices. By forming the offset spacers 122a to have a controlled width (e.g., approximately 50-150 Angstroms), the implanted halo/extension regions are formed in substantial alignment with the respective edges of the split-gate electrodes 106, 118 and sacrificial gate electrodes 121. In addition, a second set of sidewall spacers 122b may subsequently be formed as implant masks by forming a second dielectric layer (e.g., depositing silicon dioxide or nitride) which is then anisotropically etched to form sidewall spacers 122b that are adjacent to the first sidewall spacers 122a and that are used in combination with one or more patterned implant masks (not shown) to implant deep source/drain implant regions 123, 124 with appropriate polarity dopants, such as n-type source/drain regions for NMOS transistor devices or p-type source/drain regions for PMOS transistor devices.

After removing any implant masks, self-aligned silicide regions 126, 128 may be formed on any exposed semiconductor layers in the source/drain regions 123, 124, split-gate electrodes 106, 118, and sacrificial gate electrodes 121, such as by depositing and thermally annealing conductive or metal layer (e.g., cobalt or nickel) to react with the exposed semiconductor layers to form the silicide regions 126, 128. As will be appreciated, any desired silicide formation sequence may be used to form the silicide regions 126, 128, including but not limited to forming a conductive or metal layer (e.g., cobalt or nickel) over the semiconductor structure 5 to a predetermined thickness (e.g., approximately 50-200 Angstroms) and then applying one or more thermal annealing steps to react the metal layer with the underlying semiconductor layers in the source/drain regions 123, 124, split-gate electrodes 106, 118, and sacrificial gate electrodes 121 to form a silicide regions 126, 128. In an example thermal anneal sequence, an initial rapid thermal anneal step (e.g., 400-600° C.) is applied, followed by a Piranha clean step to remove the metal from the exposed surfaces of the underlying semiconductor regions 106, 123-124, and then followed by a second rapid thermal anneal step (e.g., 650-850° C.), where the timing and temperature of the thermal anneal step(s) are selected so that the metal layer reacts with the exposed surfaces of the underlying semiconductor regions, but not with the sidewall spacers 122.

Figure 6:
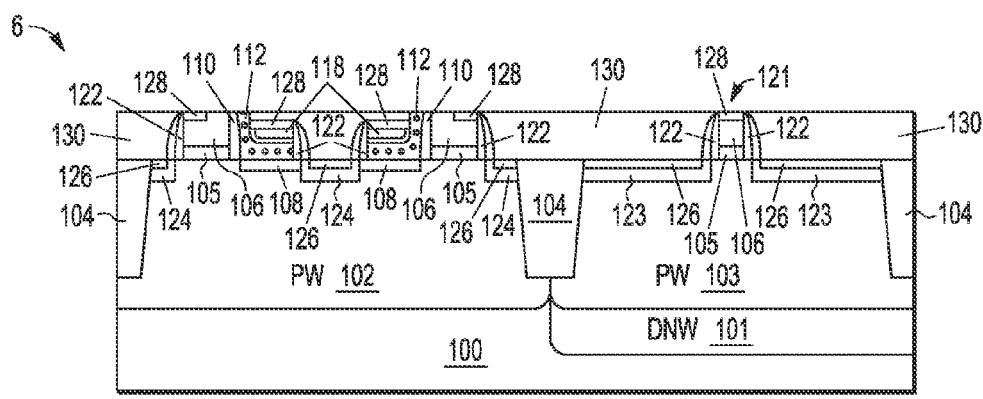

FIG. 6 illustrates processing of the semiconductor structure 6 subsequent to FIG. 5 after a planarized dielectric layer 130 is formed over the flash memory cell area 111 and CMOS area 113, and at least a portion of the split-gate electrode layer 106, charge storage layer 112 and sacrificial gate electrode 121 is exposed. In selected embodiments, the planarized dielectric layer 130 may be formed by depositing one or more planarized dielectric layers 130 over the semiconductor structure 6 to cover the flash memory cell area 111 and CMOS area 113. As part of a first interlayer dielectric stack, the planarized dielectric layer(s) 130 may be formed by depositing a dielectric layer using CVD, PECVD, PVD, or ALD to a predetermined thickness (e.g., approximately 500-5000 Angstroms) that is at least as thick as the height of the poly layers (e.g., 106) in the split-gate electrodes and sacrificial gate electrode 121. As deposited, the dielectric layer 130 can be formed alone or in combination with other dielectric layers, such as one or more gettering dielectric layers (e.g., a BPTEOS layer), sub-atmospheric tetra-ethyl ortho-silicate (SATEOS) layer(s), low-pressure TEOS (LPTEOS) CVD layer(s), plasma-enhanced TEOS (PETEOS) layer(s), and/or $SiO_xN_y$, atmospheric pressure TEOS (APTEOS) layer(s), HDP BPTEOS or HDP plasma enhanced PTEOS layer(s). In addition, the deposited dielectric layer 130 can be planarized using any desired planarization process, such as a chemical mechanical polish step, to form a substantially planar surface on the planarized dielectric layer 130. By using a timed CMP process to the planarized dielectric layer 130, the charge storage layer 112 and gate cap layer 107 formed over the polysilicon layer 106 in the split-gate electrodes 106, 112, 118 is removed so that the planarized dielectric layer 130 exposes the silicide layer 128 on top of the polysilicon layer 106 and the sacrificial gate electrode 121. In other embodiments, the CMP process removes the silicide layer 128 on top of the polysilicon layer 106 and the sacrificial gate electrode 121 without reaching or exposing the recessed control gate layer 118. As illustrated in FIG. 6, the CMP process may partially remove a portion of the split-gate electrode layers 106, charge storage layer 112 to make them substantially planar with the sacrificial gate electrode 121 without reaching or exposing the recessed control gate layer 118, or may remove a minimal amount and leave these structures with substantially their original thickness. As will be appreciated, the planarized dielectric layers 130 may be densified with one or more anneal process steps, though it will be appreciated that an anneal process may also be applied subsequently in the fabrication process.

Figure 7:
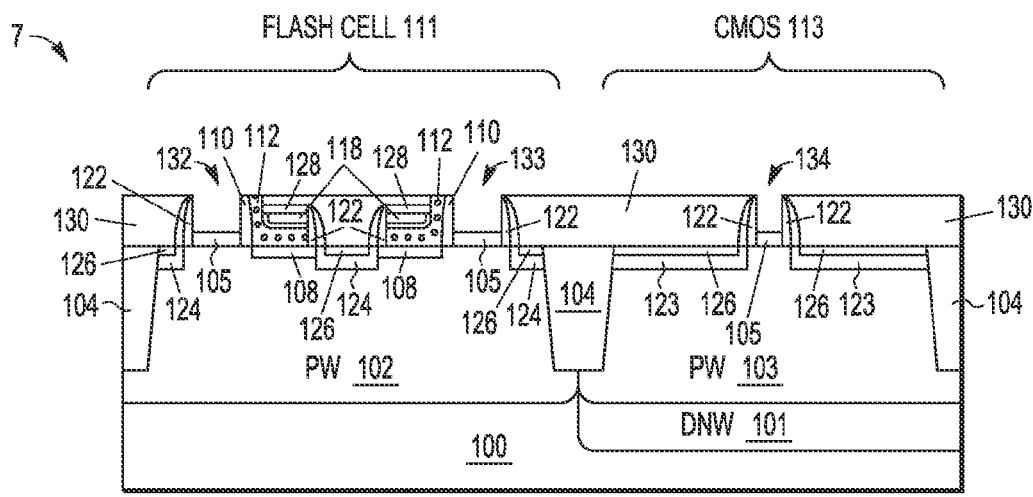

FIG. 7 illustrates processing of the semiconductor structure 7 subsequent to FIG. 6 after at least a portion of the split-gate electrodes 106 and sacrificial gate electrode 121 is removed to form gate electrode openings 132-134 in the flash cell and CMOS areas 111, 113 by applying one or more etch processes. For example, a first poly etch process is applied to remove the exposed poly layers from the patterned select gate electrodes 106 and sacrificial gate electrode 121, where the poly etch process is selective to the material (e.g., oxide) used to form the planarized dielectric layer 130, charge storage layer 112, and the spacers 122. The removal of the exposed portions of the patterned poly layers may use any desired poly etch process, including a dry etching process such as reactive-ion etching, ion beam etching, plasma etching or laser etching, a wet etching process wherein a chemical etchant is employed or any combination thereof. Once the exposed portions of the patterned poly layers are removed, the resulting electrode openings 132-134 in the flash cell and CMOS areas 111, 113 expose the previously formed high-k gate dielectric layers 105 which may be covered with a suitable barrier metal layer (not shown) and may be retained as part of the final CMOS area transistors. At this juncture as the high-k metal gate formation processing begins, the presence of the planarized dielectric layer 130 over the recessed control gate and silicide layers 118, 128 over the flash memory cell area 111 provides for superior electrical isolation between the control gate electrodes 118 and select gate electrodes 106.

Though FIG. 7 shows that the gate high-k dielectric layers 105 are retained in the gate electrode openings 132-134, it will be appreciated that these gate dielectric layers may be removed and replaced with one or more subsequently formed gate dielectric layers. For example, one or more dielectric etch processes may be applied to remove the patterned gate dielectric layers 105 and expose the underlying channel regions in the substrate 102, 103. Again, any desired dielectric etch process may be used, including a dry etching process such as reactive-ion etching, ion beam etching, plasma etching or laser etching, a wet etching process wherein a chemical etchant is employed or any combination thereof. In selected embodiments, a wet etch chemistry is applied briefly to remove the gate dielectric layer(s) 105, where the timing of the wet etch is controlled to minimize any etching of the planarized dielectric layer(s) 130 or spacers 122. Subsequently, one or more gate dielectric layers may be formed on the channel regions in the substrate 102, 103, such as be depositing or growing a base oxide layer at the bottom of the gate electrode openings 132-134, followed by the deposition of one or more high-k gate dielectric layers on the base oxide layer.

Figure 8:
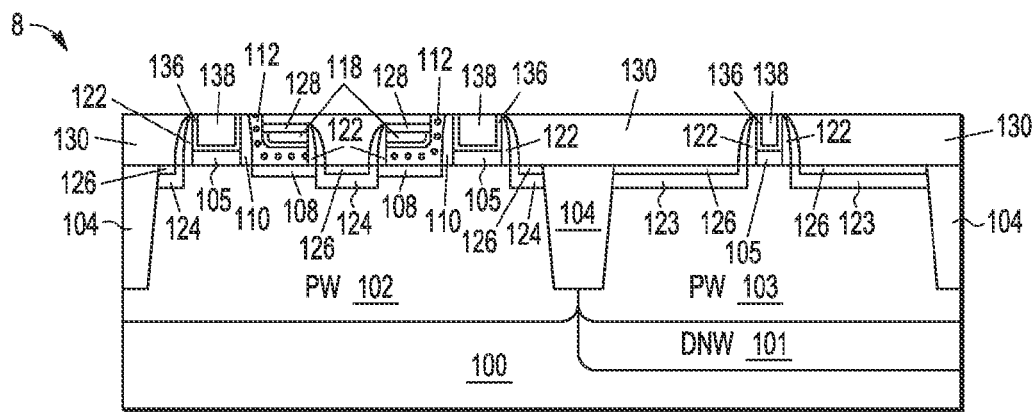

FIG. 8 illustrates processing of the semiconductor structure 8 subsequent to FIG. 7 after a replacement gate method is used to form metal gate electrodes 136, 138 on the previously formed high-k gate dielectric layers 105 in the gate electrode openings 132-134. While the metal gate electrodes may be formed with any desired technique, in selected embodiments, one or more metal interface layers 136 may be formed on the bottom of the gate electrode openings 132-134, depending on the type of transistor (e.g., NMOS or PMOS) being formed. (In the event that the dielectric layers 105 were removed from the gate electrode openings 132-134, then the appropriate gate dielectric layers would be formed prior to formation of any metal interface layer, such as by depositing or thermally growing an base oxide layer in the electrode openings 132-134, followed by deposition of an appropriate high-k gate dielectric layer to cover the base oxide layer.) As will be appreciated, the metal interface layer(s) 136 may be used to adjust the work function of the finally formed transistor, depending on its polarity type. In selected embodiments, the first metal interface layer 136 is selectively formed as a PFET work function metal layer on the high-k gate dielectric layer 105 in at least the gate electrode opening 134 used to form a PMOS transistor device, and is selectively formed as an NFET work function metal layer on the high-k gate dielectric layer 105 in at least the gate electrode opening 134 used to form a NMOS transistor device. This sequence can be implemented by depositing a first PFET metal interface layer in all exposed gate electrode openings 132-134 and over the planarized dielectric layer 130, followed by removing the first PFET metal interface layer from the NFET regions (e.g., with a patterned mask and etch process) and then depositing a second NFET metal interface layer in all exposed gate electrode openings 132-134. In similar fashion, one or more metal interface layers 136 may be selectively formed in the gate electrode openings 132-133 used to form the split-gate TFS NVM bitcells, depending on the type of bitcell (e.g., NMOS or PMOS) being formed. If desired, additional metal interface layers can be used, or alternatively, a single metal interface layer may be formed over PMOS and NMOS gate electrode openings 132-134. In addition, the metal interface layers 136 may be deposited using any desired deposition or sputtering process, such as CVD, PECVD, PVD, ALD, molecular beam deposition (MBD) or any combination(s) thereof. A suitable material for use as the metal interface layers 136 is an element or alloy (e.g., TiN, TaC, or W) which may be deposited to a predetermined thickness of 20-150 Angstroms (e.g., 50-100 Angstroms), though other metallic layer materials with different thicknesses may be used. In selected embodiments, the metal interface layers 136 may include an element selected from the group consisting of Al, Ti, Ta, La, Ir, Mo, Ru, W, Os, Nb, Ti, V, Ni, W, and Re to form a metal or metal-based layer that may contain carbon and/or nitrogen (such as TiN, TaC, HfC, TaSi, ZrC, Hf, etc.) or even a conductive metal oxide (such as $IrO_2$).

On the metal interface layer(s) 136, one or more metal gate layers 138 are formed in the gate electrode openings 132-134. In selected embodiments, the metal gate layer 138 is formed with a conductive material, such as a metal or transition metal material including, as an example, aluminum, tungsten, titanium or TiN, that is formed using metal organic chemical vapor deposition (MOCVD), CVD, PECVD, PVD, ALD, MBD, or any combination(s) thereof to a predetermined thickness in the range of 200-1000 Angstroms (e.g., 500-600 Angstroms), though other materials and thicknesses may be used. Instead of the metal gate layer 138, a doped silicon-containing gate layer 138 may be disposed over the metal interface layer(s) 136 in other embodiments to form a metal gate stack. In selected embodiments, the silicon-containing layer 138 is an amorphous or polysilicon cap layer or an amorphous/poly silicon germanium cap layer that is formed using CVD, PECVD, PVD, ALD, MBD, or any combination(s) thereof to a predetermined thickness in the range of 200-1000 Angstroms (e.g., 500-600 Angstroms), though other materials and thicknesses may be used. Silicon-containing gate layer 138 may also be a doped or undoped amorphous silicon or silicon germanium layer. However formed, the deposited metal interface and gate layers 136, 138 may then be planarized with one or more planarization steps to complete an inlaid or damascene fabrication sequence for forming the HKMG select gate and transistor gate electrodes 136, 138. While any desired planarization process may be used, in accordance with various embodiments, the semiconductor structure 8 may be planarized with one or more polish and/or etch processes, such as using a chemical mechanical polish step to planarize the upper portions of the planarized dielectric layer 130 and gate electrode structures 136, 138.

Figure 9:
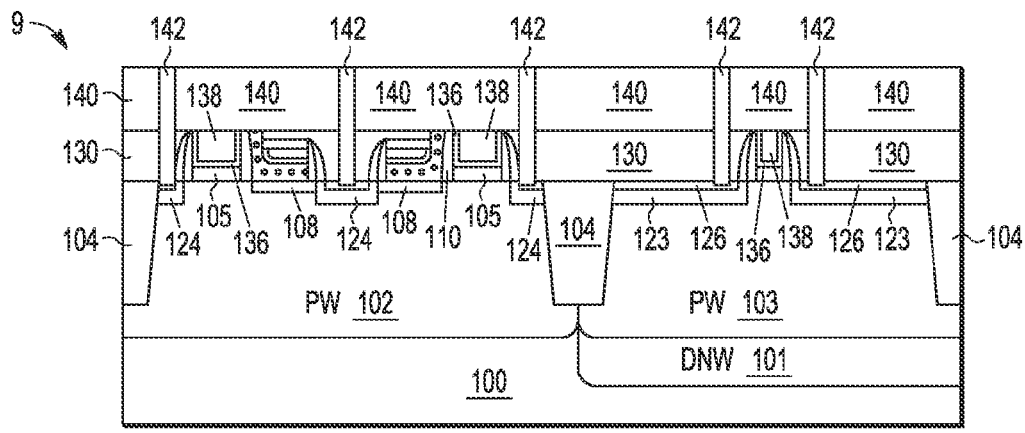

FIG. 9 illustrates processing of the semiconductor structure 9 subsequent to FIG. 8 after forming contacts 142 to the underlying flash memory cells and CMOS transistors through one or more planarized dielectric layers 130, 140. While any desired sequence may be used to form the contacts 142, in selected example embodiments, one or more planarized dielectric layer(s) 140 may be formed over the planarized dielectric layer 130 by depositing a conformal layer of silicon dioxide or other pre-metal inter-level dielectric layer(s) using CVD, PECVD, PVD, ALD or any combination thereof to a predetermined thickness (e.g., approximately 500-5000 Angstroms), though other dielectric materials or thicknesses may be used. As deposited, the dielectric layer can be planarized to form the planarized dielectric layer(s) 140, alone or in combination with other dielectric layers. At this point, the deposited dielectric layer 140 may be planarized using any desired planarization process, such as a planarization process that uses a chemical mechanical polish step to form a substantially planar surface on the planarized dielectric layer 140. In addition, the planarized dielectric layers 140 may be densified with one or more anneal process steps, though it will be appreciated that an anneal process may also be applied subsequently in the fabrication process. After forming the planarized dielectric layer 140, a patterned mask or photoresist layer (not shown) may be formed with openings aligned over the silicided bitcell connection structures 124, 126 in the flash memory cell area 111 and over the silicided source/drain contact regions 123, 126 in the CMOS transistor area 113 and over the metal gate electrodes 136, 138 (not shown). Using the patterned photoresist/mask layer, the planarized dielectric layers 130, 140 are anisotropically etched to form openings which expose the silicided bitcell connection structures 124, 126, the silicided source/drain contact regions 123, 126, and the metal gate electrodes 136, 138 (not shown). In the openings, conductive contact structures 142 are formed using any desired fabrication sequence, such as depositing one or more conductive layers to fill the openings, and then applying a CMP process to planarize the contacts 142 with the planarized dielectric layers 130, 140.

As will be appreciated, additional processing steps may be used to complete the fabrication of the split-gate nonvolatile memory cells and NMOS/PMOS transistors. In addition to various front end processing steps (such as sacrificial oxide formation, stripping, isolation region formation, gate electrode formation, extension implant, halo implant, spacer formation, source/drain implant, annealing, silicide formation, and polishing steps), additional backend processing steps may be performed, such as forming contact openings, contact plugs and multiple levels of interconnect(s) that are used to connect the device components in a desired manner to achieve the desired functionality. Thus, the specific sequence of steps used to complete the fabrication of the device components may vary, depending on the process and/or design requirements.

Figure 10:
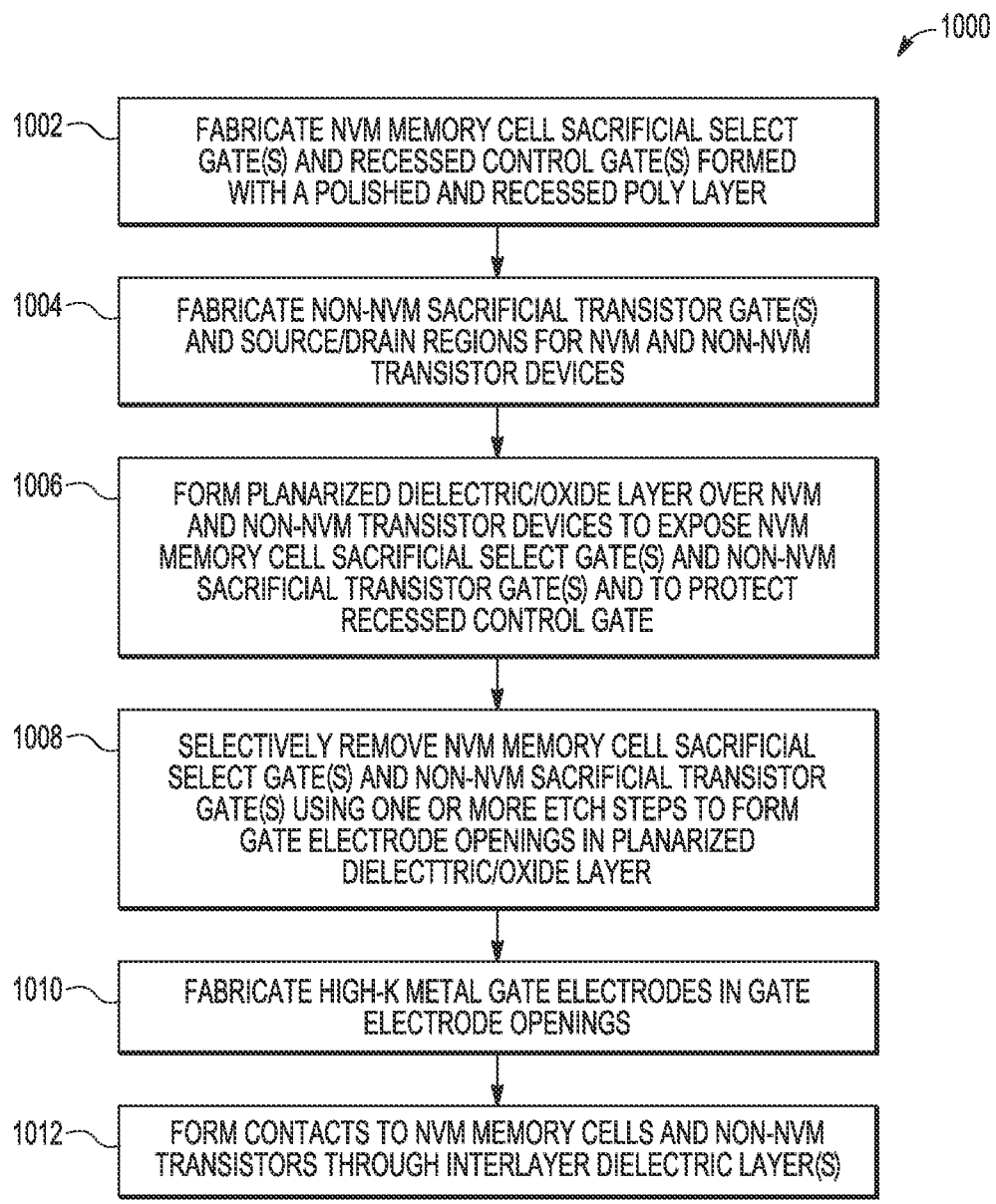
FIG. 10 illustrates an example process flow diagram of a fabrication sequence for integrating split-gate NVM memory cells having recessed poly control gates and in-laid high-k metal select gates formed with a replacement gate sequence for fabricating gate last high-k metal gate electrodes.

Turning now to FIG. 10, there is shown an example process flow diagram of a fabrication sequence 1000 for integrating split-gate NVM memory cells having recessed control gates and in-laid high-k metal select gates formed with a replacement gate sequence for fabricating gate last high-k metal gate electrodes. As shown, the process begins at step 1002 during the front end of line (FEOL) process for forming split-gate flash memory cells with one or more gate electrodes fabricated using a layer combination of metal, polysilicon, high-k dielectric. During the FEOL process, nonvolatile memory cells are fabricated with sacrificial poly select gate electrodes formed adjacent to recessed control gate electrodes over one or more non-volatile memory (NVM) areas. For example, split gate TFS NVM bitcells may be formed with one or more patterned select gates, each having an adjacent charge-storing metal or silicide nanocrystal stack of high-k dielectric with a recessed control gate that is formed with a polished and/or recessed poly layer so that the top of the recessed control gate is recessed below the top of the corresponding patterned poly select gate.

At step 1004, one or more sacrificial transistor gate electrodes are formed over non-NVM areas so that source/drain regions may be formed in both the NVM and non-NVM areas. For example, sacrificial poly gate electrodes may be formed in non-NVM areas (e.g., where low voltage CMOS transistors will be formed) by patterning a gate stack which includes a poly layer and a barrier metal layer formed over a high-k gate dielectric layer. Once sacrificial select gate electrodes, recessed control gate electrodes, and sacrificial transistor gate electrodes are patterned, source and drain regions may be defined in the underlying substrate by implanting appropriate source/drain implants around the gate electrodes, alone or in combination with one or more sidewall spacers and/or implant masks. In an example sequence, one or more sidewall spacers are formed on the sacrificial select gate electrodes and recessed control gate electrodes (in the NVM area) and sacrificial transistor gate electrodes (in a CMOS device area) and are used to implant source/drain regions in the exposed substrate areas.

Next, a first planarized dielectric layer is formed over the split-gate NVM transistor devices and over the non-NVM transistor devices at step 1006. For example, the first planarized dielectric layer may be formed by depositing a conformal layer or film of silicon oxide or other interlayer dielectric stack layer(s) which is then polished to a flat or planarized surface which covers and protects the recessed control gate electrodes in the NVM area, but exposes the sacrificial select gate electrodes in the NVM area and the sacrificial transistor gate electrodes in the non-NVM area.

At step 1008, the sacrificial select gate electrodes in the NVM area and sacrificial transistor gate electrodes in the non-NVM area are selectively removed using one or more etch steps to form gate electrode openings in the first planarized dielectric layer. For example, one or more poly etch steps may be applied to remove the upper poly layer in the sacrificial select gate electrodes and sacrificial transistor gate electrodes, though one or more additional oxide etch steps may also be applied to remove one or both of the underlying barrier metal layer and gate dielectric layer.

At step 1010, high-k metal gate (HKMG) electrodes are formed in the gate electrode openings in the first planarized dielectric layer using a replacement gate method, thereby forming in-laid HKMG select gate electrodes and HKMG transistor gate electrodes in the gate electrode openings. While different materials and processes may be used to form the constituent layers for HKMG electrodes, the HKMG select and transistor gate electrodes may be formed by depositing and planarizing at least a first metal interface layer and metal-based gate electrode layer in the gate electrode openings.

At step 1012, one or more contacts are formed to the split-gate nonvolatile memory cells and NMOS/PMOS transistors. In selected example embodiments, the contact are formed by first forming a second planarized dielectric layer over the non-NVM and NVM areas, forming contact openings through one or more planarized dielectric layers to the split-gate nonvolatile memory cells and NMOS/PMOS transistors, and then filling the contact openings with one or more conductive contact layers which may be planarized (e.g., with a CMP process).

As seen from above, the fabrication sequence 1000 is described with reference to specified NVM and non-NVM areas where sacrificial select gate electrodes and transistor gate electrodes are exposed by a planarized dielectric layer which is formed over the NVM and non-NVM wafer areas and which isolates previously-formed recessed control gate electrodes from the metal gate processing effects (e.g., metallic contamination) used in a gate last process flow to form high-k metal replacement gate electrodes in place of the sacrificial select gate electrodes and transistor gate electrodes, thereby defining TFS bitcells in the NVM area with an in-laid HKMG select gate and recessed HK-metal-poly control gate. However, it will be appreciated that various benefits of the present disclosure may also be obtained from forming the recessed control gate electrodes on a recessed control gate channels by performing a substrate recess etch when patterning the sacrificial select gate electrodes, or by otherwise elevating the top of the sacrificial select gate electrodes with respect to the top of the recessed control gate electrodes. In addition, it will be appreciated that other types of split-gate NVM bitcell devices may be formed with different sequencing and/or materials. And though selected embodiments are described for using a split-gate NVM cell with a storage layer containing conductive nanoclusters, any desired NVM cell structures may also be used, provided that the recessed control gate electrodes are protected during formation of the replacement select gates and CMOS transistor gates. Examples of alternative NVM cells include a split-gate cell utilizing a nitride storage layer, and a one-transistor NVM cell utilizing nitride storage (also known as a SONOS NVM cell), and the like.

By now it should be appreciated that there is provided herein a semiconductor fabrication process for embedding non-volatile memory devices in an HKMG CMOS process. In the disclosed process, nonvolatile memory (NVM) split-gate structures are formed over one or more first substrate areas of a wafer, where each split-gate structure includes a sacrificial poly select gate, a nanocrystal stack, and a recessed control gate formed adjacent to the nanocrystal stack with an upper surface which is recessed below an upper surface of the sacrificial poly select gate. In selected embodiments, the split-gate structures may be formed as split-gate thin film storage bitcells, each having a recessed polysilicon (or poly-metal) control gate formed adjacent to the nanocrystal stack by depositing a barrier metal layer and a polysilicon layer over the sacrificial poly select gate and a nanocrystal stack, and then polishing the polysilicon layer and barrier metal layer to form a polished polysilicon layer which is etched to form a recessed poly-metal control gate having an upper surface which is recessed below the upper surface of the sacrificial poly select gate. In addition, sacrificial transistor gate structures are formed over one or more second substrate areas of the wafer, where each sacrificial transistor gate structure includes a sacrificial poly gate having an upper surface with is substantially coplanar with the upper surface of the sacrificial poly select gate. In selected embodiments, the sacrificial transistor gate structures may be formed by depositing one or more high-k dielectric layers over the one or more second substrate areas of the wafer using a dielectric material which has a dielectric constant value of 7.0 or greater; depositing one or more barrier metal layers over the high-k dielectric layers; depositing one or more polysilicon gate electrode layers over the barrier metal layers; and patterning and etching the one or more polysilicon-metal gate electrode layers and one or more high-k dielectric layers formed over the one or more second substrate areas to form the plurality of sacrificial transistor gate structures while protecting the recessed control gate in each split-gate structure. To protect the recessed control gate in each split-gate structure, a planarized dielectric layer is formed over the wafer to cover the recessed control gate and expose at least the upper surface of the sacrificial poly select gate and the sacrificial poly gate. In selected embodiments, the planarized dielectric layer is formed by depositing a dielectric layer (e.g., oxide) over the wafer to cover the split-gate structures and the sacrificial transistor gate structures, and then planarizing the dielectric layer with a chemical mechanical polish process to form a substantially flat upper surface to protect at least the recessed control gate in each split-gate structure and to expose at least the upper surface of the sacrificial poly select gate and the sacrificial poly gate. Subsequently, at least the sacrificial poly select gates and the sacrificial poly gates are selectively removed to form gate electrode openings in the planarized dielectric layer without removing the recessed control gates. In selected embodiments, the sacrificial poly select gates and sacrificial poly gates may be selectively removed by applying one or more poly etch processes to remove the sacrificial poly select gates and sacrificial poly gates from the plurality of split-gate structures and the plurality of sacrificial transistor gate structures without removing the recessed control gates from the plurality of split-gate structures. In other embodiments, the sacrificial poly select gates and sacrificial poly gates may be selectively removed by applying one or more poly etch processes to remove the one or more polysilicon gate electrode layers to expose an underlying barrier metal and high-k gate dielectric layer in the plurality of gate electrode openings. In the gate electrode openings, high-k metal gate (HKMG) electrodes are formed while protecting each recessed control gate in each split-gate structure with the planarized dielectric layer, thereby forming high-k metal select gates to replace the sacrificial poly select gates in the plurality of split-gate structures. In selected embodiments, the HKMG electrodes may be formed by depositing a metal layer in the gate electrode openings which is then polished down to be substantially coplanar with the planarized dielectric layer to define the plurality of high-k metal gate electrodes, each having an upper surface which is elevated above the upper surface of a corresponding recessed control gate. In other embodiments, the HKMG electrodes are formed as in-laid metal select gates in one or more of the plurality of gate electrode openings to cover at least a high-k gate dielectric layer, each replacing a corresponding sacrificial poly select gate while protecting a corresponding recessed control gate with the planarized dielectric layer. In addition, the HKMG electrodes may be formed as metal transistor gates in one or more of the plurality of gate electrode openings to cover at least a high-k gate dielectric layer, each replacing a corresponding sacrificial poly gate. In other embodiments, the HKMG electrodes may be formed by depositing a first metal interface layer in the gate electrode openings to cover an underlying high-k dielectric layer; depositing one or more metal gate electrode layers in the gate electrode openings to cover the first metal interface layer; and applying one or more polish and/or etch steps to form a plurality of planarized high-k metal-gate electrodes that are substantially coplanar with the planarized dielectric layer.

In another form, there is disclosed a semiconductor device and associated method of forming same. In the disclosed methodology and device, there is provided a wafer having a logic region and a non-volatile memory region. On the wafer, a sacrificial select gate electrode is formed over the non-volatile memory region and a protective stack is formed over the logic region. In selected embodiments, the sacrificial select gate electrode and protective stack are formed by depositing or growing a first dielectric layer on the wafer over the logic region and non-volatile memory region, forming a first polysilicon layer on the first dielectric layer, forming a second dielectric layer on the first polysilicon layer, and patterning the second dielectric layer, first polysilicon layer, and first dielectric layer to define one or more dielectric-capped sacrificial select gate electrodes over the non-volatile memory region and to define a dielectric-capped protective stack over the logic region. In other embodiments, the sacrificial select gate electrode in the non-volatile memory region is formed with a patterned poly select gate formed over a high-k gate dielectric layer and barrier metal layer, and the protective stack in the logic region is formed with a patterned poly protective layer formed over a high-k gate dielectric layer and barrier metal layer. Using the sacrificial select gate electrode, a non-volatile memory cell structure is formed which includes a recessed control gate electrode with an upper surface that is below an upper surface of the sacrificial select gate electrode, and one or more source/drain regions that are adjacent to the sacrificial select gate electrode. In selected embodiments, the non-volatile memory cell structure is formed as a split-gate thin film storage bitcell having a recessed polysilicon control gate electrode formed by polishing and etching a polysilicon layer formed over a nanocrystal layer so that the recessed polysilicon control gate electrode has an upper surface that is below an upper surface of the sacrificial select gate electrode. In other embodiments, the non-volatile memory cell structure is formed by depositing a polysilicon layer to cover a charge storage layer formed on the sacrificial select gate electrode in the non-volatile memory region; applying a chemical mechanical polish to planarize the polysilicon layer into a polished polysilicon layer having an upper surface that is substantially coplanar with the upper surface of the sacrificial select gate electrode; and applying a recess etch to the polished polysilicon layer to form a recessed polysilicon layer to be adjacent to a portion of the charge storage layer which separates the recessed polysilicon layer from the sacrificial select gate electrode. In yet other embodiments, the non-volatile memory cell structure is formed by depositing a barrier metal layer to cover the charge storage layer on a top and sidewall surface of the sacrificial select gate electrode in the non-volatile memory region, and then forming a polysilicon layer on the barrier metal layer. By applying a first chemical mechanical polish, the polysilicon layer is planarized down to the barrier metal layer formed on top of the sacrificial select gate electrode. A second chemical mechanical polish is applied to remove the barrier metal layer from the top of the sacrificial select gate electrode, thereby forming a polished polysilicon layer adjacent to the sacrificial select gate electrode which has an upper surface that is substantially coplanar with the top of the sacrificial select gate electrode. Finally, a recess etch is applied to the polished polysilicon layer to form the recessed control gate electrode as a recessed polysilicon layer which has an upper surface that is recessed below the upper surface of the sacrificial select gate electrode. As formed, the recessed polysilicon layer and part of the charge storage layer formed over the sacrificial select gate electrode may be patterned and etched to form the non-volatile memory cell. After forming the non-volatile memory cell, the protective stack may be patterned and etched to form a sacrificial transistor gate structure over the logic region; such as by applying one or more etch processes to the protective stack using a patterned each mask. Subsequently, metal gates are formed on the wafer by replacing the sacrificial select gate electrode with a metal select gate electrode in the non-volatile memory region while replacing the sacrificial transistor gate structure with a metal gate electrode in the logic region using a replacement gate process. In selected embodiments, the metal gates are formed by forming one or more sacrificial transistor gate electrodes over the logic region of the wafer while protecting the recessed control gate electrode of the non-volatile memory cell structure with one or more protective dielectric layers. Subsequently, a planarized dielectric layer is formed which exposes an upper surface of the one or more sacrificial transistor gate electrodes and the upper surface of the sacrificial select gate electrode, and at least part of the one or more sacrificial transistor gate electrodes and the sacrificial select gate electrode are selectively removed to form gate electrode openings in the planarized dielectric layer. In each gate electrode opening, a high-k metal gate electrode may be formed.

In yet another form, there is provided a semiconductor device with integrated logic and non-volatile memory cells and associated method for fabricating same. As disclosed, the semiconductor device includes a semiconductor substrate which has a logic region and a non-volatile memory region. The semiconductor device also includes one or more split-gate thin film storage bitcells formed in the non-volatile memory region of the semiconductor substrate, each having a high-k metal select gate electrode, a nanocrystal stack layer located on a sidewall of the high-k metal select gate electrode, and a polished control gate having an upper surface which is recessed below an upper surface of the high-k metal select gate electrode. The semiconductor device also includes one or more high-k metal gate logic transistors formed on the logic region of the substrate using a replacement gate process, where the one or more high-k metal gate logic transistors comprise gate electrodes that are substantially coplanar with the high-k metal select gate electrode.

Although the described exemplary embodiments disclosed herein are directed to various semiconductor device structures and methods for making same using an integrated HKMG process to form polished poly control gates which are recessed below in-laid high-k metal select gates formed with a replacement gate sequence for fabricating gate last high-k metal gate electrodes, the present invention is not necessarily limited to the example embodiments which illustrate inventive aspects of the present invention that are applicable to a wide variety of fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various poly gate electrode devices are illustrated as being split-gate flash memory devices, this is merely for convenience of explanation and not intended to be limiting and persons of skill in the art will understand that the principles taught herein apply to devices of either conductivity type. Accordingly, other types of poly gate devices may be formed on-chip with metal-gate electrodes as disclosed herein. Moreover, the thicknesses and doping concentrations of the described layers may deviate from the disclosed ranges or values. In addition, the terms of relative position used in the description and the claims, if any, are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor fabrication process comprising:
forming a plurality of split-gate structures over one or more first substrate areas of a wafer, each split-gate structure comprising a sacrificial poly select gate, a nanocrystal stack, and a recessed control gate formed adjacent to the nanocrystal stack with an upper surface which is recessed below an upper surface of the sacrificial poly select gate;
forming a plurality of sacrificial transistor gate structures over one or more second substrate areas of the wafer, each sacrificial transistor gate structure comprising a sacrificial poly gate having an upper surface with is substantially coplanar with the upper surface of the sacrificial poly select gate;
forming a planarized dielectric layer over the wafer which protects at least the recessed control gate in each split-gate structure and which exposes at least the upper surface of the sacrificial poly select gate and each sacrificial poly gate;
selectively removing at least the sacrificial poly select gates and the sacrificial poly gates to form a plurality of gate electrode openings in the planarized dielectric layer without removing any recessed control gate; and
forming a plurality of high-k metal gate electrodes in the plurality of gate electrode openings while protecting each recessed control gate in each split-gate structure with the planarized dielectric layer, thereby forming high-k metal select gates to replace the sacrificial poly select gates in the plurality of split-gate structures.

2. The semiconductor fabrication process of claim 1, where forming the plurality of split-gate structures comprises forming a plurality of split-gate storage bitcells, each comprising a recessed polysilicon control gate formed adjacent to the nanocrystal stack by depositing a barrier metal layer and a polysilicon layer over the sacrificial poly select gate and nanocrystal stack, and then polishing the polysilicon layer and barrier metal layer to form a polished polysilicon layer which is etched to form a recessed polysilicon control gate having an upper surface which is recessed below the upper surface of the sacrificial poly select gate.

3. The semiconductor fabrication process of claim 1, where forming the planarized dielectric layer comprises:
depositing a dielectric layer over the wafer to cover the plurality of split-gate structures and the plurality of sacrificial transistor gate structures, and
planarizing the dielectric layer with a chemical mechanical polish process to form a substantially flat upper surface to protect at least the recessed control gate in each split-gate structure and to expose at least the upper surface of the sacrificial poly select gate and each sacrificial poly gate.

4. The semiconductor fabrication process of claim 1, where forming the plurality of high-k metal gate electrodes comprises:
forming a metal layer in the plurality of gate electrode openings; and
polishing the metal layer down to be substantially coplanar with the planarized dielectric layer to define the plurality of high-k metal gate electrodes, each having an upper surface which is elevated above the upper surface of the recessed control gate.

5. The semiconductor fabrication process of claim 1, where forming the plurality of high-k metal gate electrodes comprises:
forming a plurality of in-laid metal select gates in the plurality of gate electrode openings to cover at least a high-k gate dielectric layer, each in-laid metal select gate replacing a corresponding sacrificial poly select gate while protecting a corresponding recessed control gate with the planarized dielectric layer.

6. The semiconductor fabrication process of claim 1, where forming the plurality of high-k metal gate electrodes comprises:
forming a plurality of metal transistor gates in the plurality of gate electrode openings to cover at least a high-k gate dielectric layer, each metal transistor gate replacing a corresponding sacrificial poly gate.

7. The semiconductor fabrication process of claim 1, where selectively removing at least the sacrificial poly select gates and sacrificial poly gates comprises:
applying one or more poly etch processes to remove the sacrificial poly select gates and sacrificial poly gates from the plurality of split-gate structures and the plurality of sacrificial transistor gate structures without removing any recessed control gate.

8. The semiconductor fabrication process of claim 1, where forming the plurality of sacrificial transistor gate structures comprises:
forming one or more high-k dielectric layers over the one or more second substrate areas of the wafer using a dielectric material which has a dielectric constant value of 7.0 or greater;
depositing one or more barrier metal layers over the one or more high-k dielectric layers;
depositing one or more polysilicon gate electrode layers over the one or more barrier metal layers; and
patterning and etching the one or more polysilicon gate electrode layers, barrier metal layers, and high-k dielectric layers formed over the one or more second substrate areas to form the plurality of sacrificial transistor gate structures while protecting the recessed control gate in each split-gate structure.

9. The semiconductor fabrication process of claim 8, where selectively removing at least the sacrificial poly select gates and sacrificial poly gates comprises applying one or more poly etch processes to remove the one or more polysilicon gate electrode layers to expose an underlying barrier metal layer in the plurality of gate electrode openings.

10. The semiconductor fabrication process of claim 9, where forming the plurality of high-k metal gate electrodes comprises:
depositing a first metal interface layer in the plurality of gate electrode openings to cover an underlying barrier metal layer;
depositing one or more metal gate electrode layers in the plurality of gate electrode openings to cover the first metal interface layer; and
applying one or more polish and/or etch steps to form a plurality of planarized high-k metal-gate electrodes that are substantially coplanar with the planarized dielectric layer.

11. A method for forming a semiconductor device comprising:
providing a wafer comprising a logic region and a non-volatile memory region;
forming a sacrificial select gate electrode over the non-volatile memory region and a protective stack over the logic region;
forming a non-volatile memory cell structure over the non-volatile memory region, where the non-volatile memory cell structure comprises:
a recessed control gate electrode with an upper surface that is below an upper surface of the sacrificial select gate electrode; and
one or more source/drain regions in the non-volatile memory region of the wafer that are adjacent to the sacrificial select gate electrode;
patterning and etching the protective stack to form a sacrificial transistor gate structure over the logic region;
forming a plurality of metal gates by replacing the sacrificial select gate electrode with a metal select gate electrode in the non-volatile memory region while replacing the sacrificial transistor gate structure with a metal gate electrode in the logic region using a replacement gate process.

12. The method of claim 11, where forming the sacrificial select gate electrode and protective stack comprises:
forming a first dielectric layer on the wafer over the logic region and non-volatile memory region;
forming a first polysilicon layer on the first dielectric layer over the logic region and non-volatile memory region;
forming a second dielectric layer on the first polysilicon layer over the logic region and non-volatile memory region; and
patterning the second dielectric layer, first polysilicon layer, and first dielectric layer to define one or more dielectric-capped sacrificial select gate electrodes over the non-volatile memory region and to define a dielectric-capped protective stack over the logic region.

13. The method of claim 11, where forming the sacrificial select gate electrode and protective stack comprises:
forming the sacrificial select gate electrode in the non-volatile memory region with a patterned poly select gate formed over a high-k gate dielectric layer and barrier metal layer; and
forming the protective stack in the logic region with a patterned poly protective layer formed over a high-k gate dielectric layer and barrier metal layer.

14. The method of claim 11, where forming the non-volatile memory cell structure comprises forming a split-gate thin film storage bitcell comprising a recessed polysilicon control gate electrode formed by polishing and etching a polysilicon layer formed over a nanocrystal layer so that the recessed polysilicon control gate electrode has an upper surface that is below an upper surface of the sacrificial select gate electrode.

15. The method of claim 11, where forming the non-volatile memory cell structure comprises:
depositing a polysilicon layer to cover a charge storage layer formed on the sacrificial select gate electrode in the non-volatile memory region;
applying a chemical mechanical polish to planarize the polysilicon layer into a polished polysilicon layer having an upper surface that is substantially coplanar with the upper surface of the sacrificial select gate electrode; and
applying a recess etch to the polished polysilicon layer to form a recessed polysilicon layer to be adjacent to a portion of the charge storage layer which separates the recessed polysilicon layer from the sacrificial select gate electrode.

16. The method of claim 15, further comprising patterning and etching the recessed polysilicon layer and part of the charge storage layer formed over the sacrificial select gate electrode to form the non-volatile memory cell structure.

17. The method of claim 11, where patterning and etching the protective stack comprises applying one or more etch processes to the protective stack using a patterned etch mask.

18. The method of claim 11, where forming the non-volatile memory cell structure comprises:
   depositing barrier metal layer to cover the charge storage layer on a top and sidewall surface of the sacrificial select gate electrode in the non-volatile memory region;
   forming a polysilicon layer on the barrier metal layer;
   applying a first chemical mechanical polish to planarize the polysilicon layer down to the barrier metal layer formed on top of the sacrificial select gate electrode; and
   applying a second chemical mechanical polish to remove the barrier metal layer from the top of the sacrificial select gate electrode, thereby forming a polished polysilicon layer adjacent to the sacrificial select gate electrode which has an upper surface that is substantially coplanar with the top of the sacrificial select gate electrode; and
   applying a recess etch to the polished polysilicon layer to form the recessed control gate electrode as a recessed polysilicon layer which has an upper surface that is recessed below the upper surface of the sacrificial select gate electrode.

19. The method of claim 11, where forming the plurality of metal gates comprises:
   forming one or more sacrificial transistor gate electrodes over the logic region of the wafer while protecting the recessed control gate electrode of the non-volatile memory cell structure with one or more protective dielectric layers;
   forming a planarized dielectric layer which exposes an upper surface of the one or more sacrificial transistor gate electrodes and the upper surface of the sacrificial select gate electrode;
   selectively removing at least part of the one or more sacrificial transistor gate electrodes and the sacrificial select gate electrode to form gate electrode openings in the planarized dielectric layer; and
   forming a high-k metal gate electrode in each gate electrode opening.

* * * * *